United States Patent [19]
Furukawa et al.

[11] 4,053,831
[45] Oct. 11, 1977

[54] WAVEFORM ANALYSIS SYSTEM

[75] Inventors: Masamichi Furukawa; Susumu Iguchi, both of Tokyo, Japan

[73] Assignee: Ricoh Co., Ltd., Tokyo, Japan

[21] Appl. No.: 671,212

[22] Filed: Mar. 29, 1976

[30] Foreign Application Priority Data

| Mar. 30, 1975 | Japan | 50-38160 |
| Mar. 31, 1975 | Japan | 50-38830 |
| Mar. 31, 1975 | Japan | 50-38831 |
| Mar. 31, 1975 | Japan | 50-38832 |

[51] Int. Cl.$^2$ .................................... G01R 23/16
[52] U.S. Cl. .......................... 324/77 A; 324/121 R
[58] Field of Search .................. 324/121 R, 77 A; 340/324 A

[56] References Cited
U.S. PATENT DOCUMENTS 3,662,373   5/1972   Schumann ................ 324/121 R

*Primary Examiner*—M. Tokar
*Attorney, Agent, or Firm*—Frank J. Jordan

[57] ABSTRACT

An address counter sequentially addresses locations in a shift register or random access memory in which a waveform is stored in digital form to display the waveform on a cathode ray tube. Several magnification ranges are provided so that a selected portion of the waveform may be viewed in magnified form. A manually controllable position counter selects the portion of the magnified waveform for viewing in such a manner that the center of the portion will remain in the center of the cathode ray tube when the system is switched between magnification ranges. The position counter is an up-down counter which is driven by a same clock pulse generator which drives the address counter. A variable frequency divider is provided between the clock pulse generator and the position counter in such a manner that the position counter is driven at a convenient speed regardless of the magnification range. Two manually controllable mark counters similar to the location counter are also driven from the clock pulse generator, and indicate memory locations for which respective markers are to be displayed on the cathode ray tube. The contents of the memory location corresponding to the first of the markers is displayed in digital form, and the time difference between the markers is also measured and displayed in digital form. Variable frequency dividers provide magnitude and time scaling for the digital displays, and also ensure movement of the markers on the cathode ray tube at a convenient speed regardless of the magnification range. The frequency dividers are switched so that the address and mark counters are driven at low speed when the selected portion for magnification and marks are addressed and at high speed at other times.

25 Claims, 19 Drawing Figures

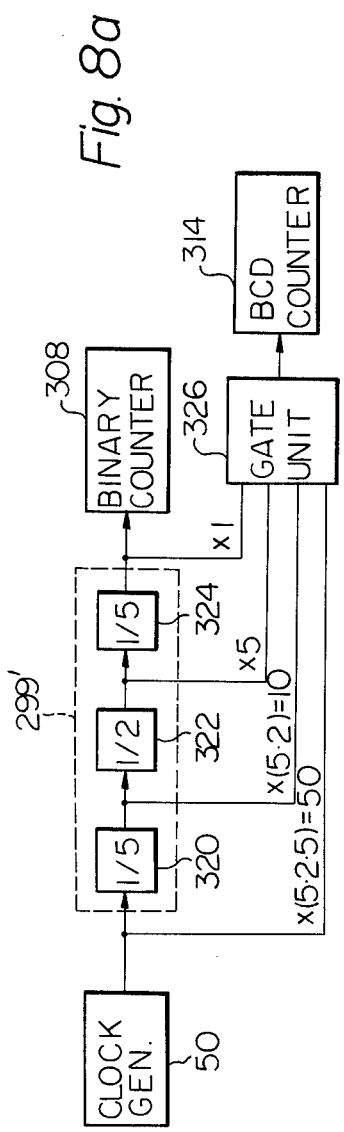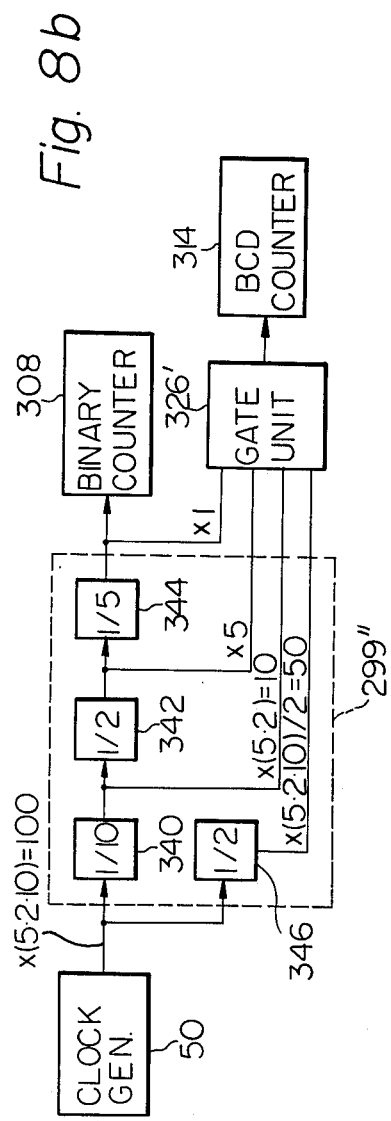

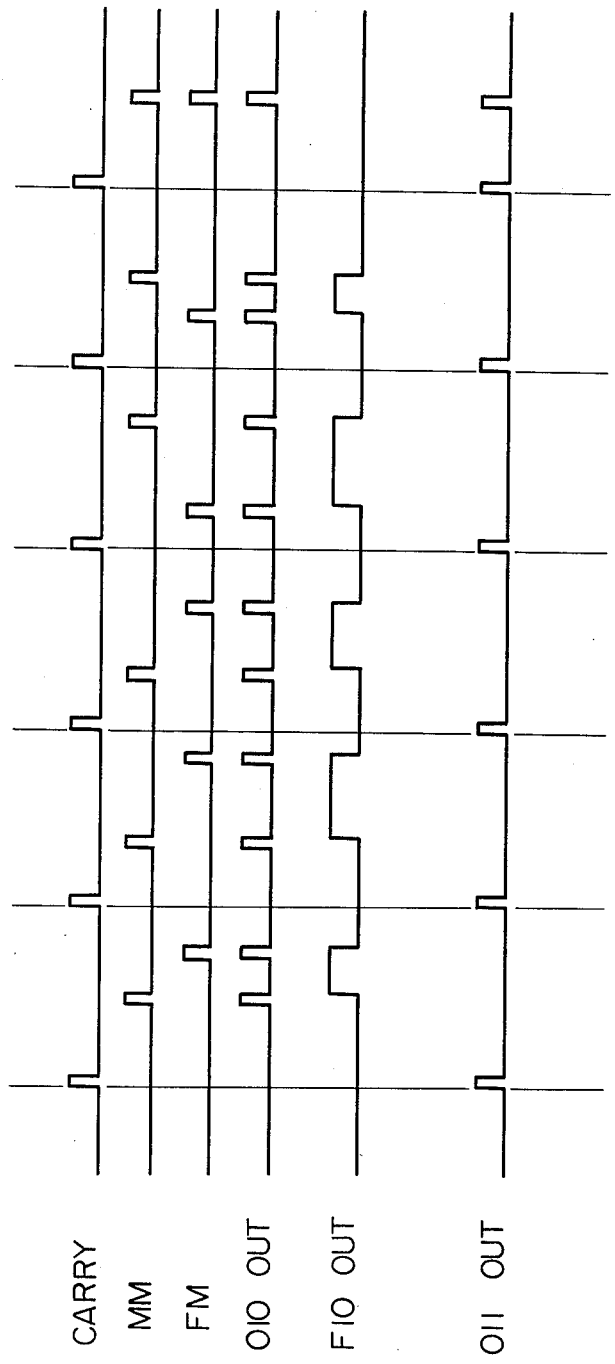

4,053,831

WAVEFORM ANALYSIS SYSTEM

BACKGROUND OF THE INVENTION

1. Field of the Invention

The present invention relates to a waveform analysis system.

It is known in the art of waveform analysis to store a waveform of a voiceprint, electrically scanned signature or the like in a digital memory, and sequentially scan the addresses of the memory to display the waveform on a cathode ray tube screen. The memory may be a circulation shift register or a random access memory. It is desirable to provide some means of measuring the magnitude of the waveform at any selected point and also the time difference between two points. Such a system is especially useful in the analysis of aperiodic waveforms.

2. Description of the Prior Art

In a known system, an address counter is driven by clock pulses to sequentially address the memory locations for display. A digital keyboard type switch is provided to input an address of a point on the waveform at which it is desired to measure the magnitude of the waveform. A comparator compares the address input by the switch with the address in the address counter and generates a signal in response to coincidence. The signal causes a marker to be displayed on the screen at a corresponding point and also the contents of the location to be latched into an indicator for digital display of the magnitude of the waveform. This system suffers from a disadvantage in that it is not easy to guess the numerical address of the desired point on the waveform exactly, and a number of addresses must be keyed into the system in order to locate the desired address by estimating the distance between the desired point on the waveform and the marker and making address corrections based on the estimates until the marker is located on the desired point. This prior art system is therefore slow and cumbersome to operate.

It is further desirable to be able to display only a selected portion of the waveform in magnified form on the screen to facilitate analysis of minute characteristics of the waveform. With the keyboard input system of the prior art, a change in the scale of the magnified waveform on the screen will means that two points at two corresponding addresses will be spaced apart from each other by different distances depending on the magnification. This makes it even harder to guess the address of the point at which the magnitude of the waveform is to be measured, and at high magnification a wrong guess can easily place the marker off the display.

Another problem associated with the magnitude and time measurement of the prior art system is that the waveform is often stored in the memory in scaled form. For example, if the memory is capable of storing a binary number having 8 bits, the memory can store 256 discrete states (0 to 255). If a waveform to be stored in the memory has a maximum magnitude of, for example, 500 volts, it cannot be stored on a one bit per volt basis, but must be scaled down by a factor of at least two. The binary number representing each point on the waveform is thereby the actual value of the input voltage divided by the scale factor such as two. The time scale of the stored waveform is often also compressed or expanded to fit the waveform into the memory.

To provide a direct digital indication of the actual magnitude of the waveform and time difference (or space difference in the case of a signature) it is necessary to provide a descaling system for the digital displays. In prior art systems, such descaling means comprise read-only memory (ROM) converters or complicated gating systems which are expensive to implement and are limited in the descaling range which can be provided.

Summary of the Invention

It is therefore an object of the present invention to provide a waveform analysis system comprising a novel marker positioning means including an up-down marker counter driven by the same clock pulses which drive a memory address counter, the marker counter being controlled by simple switches in such a manner as to slew the marker on the display screen and eliminate the need for knowing the actual memory address corresponding to a desired measuring point.

It is another object of the invention to provide a waveform analysis system comprising means for magnifying a desired portion of the waveform and controlling the marker counter so that the slew rate of the marker counter is the same regardless of the magnification degree.

It is another object of the invention to provide a waveform analysis system comprising two movable markers and means for automatically measuring the displacement between the two markers.

It is another object of the invention to provide a waveform analysis system comprising clock pulse driven magnitude and time difference measuring and indicating means including frequency dividers which enable a wide scaling range.

The above and other objects, features and advantages of the present invention will become clear from the following detailed description taken with the accompanying drawings.

BRIEF DESCRIPTION OF THE DRAWING

FIG. 8a is a schematic diagram illustrating a first modification of part of the magnitude indicator unit;

FIG. 8b is similar to FIG. 8a and illustrates a second modification;

FIG. 11 is a timing chart illustrating the operation of the time difference measurement control unit of FIG. 9.

DESCRIPTION OF THE PREFERRED EMBODIMENTS

Figure 1:
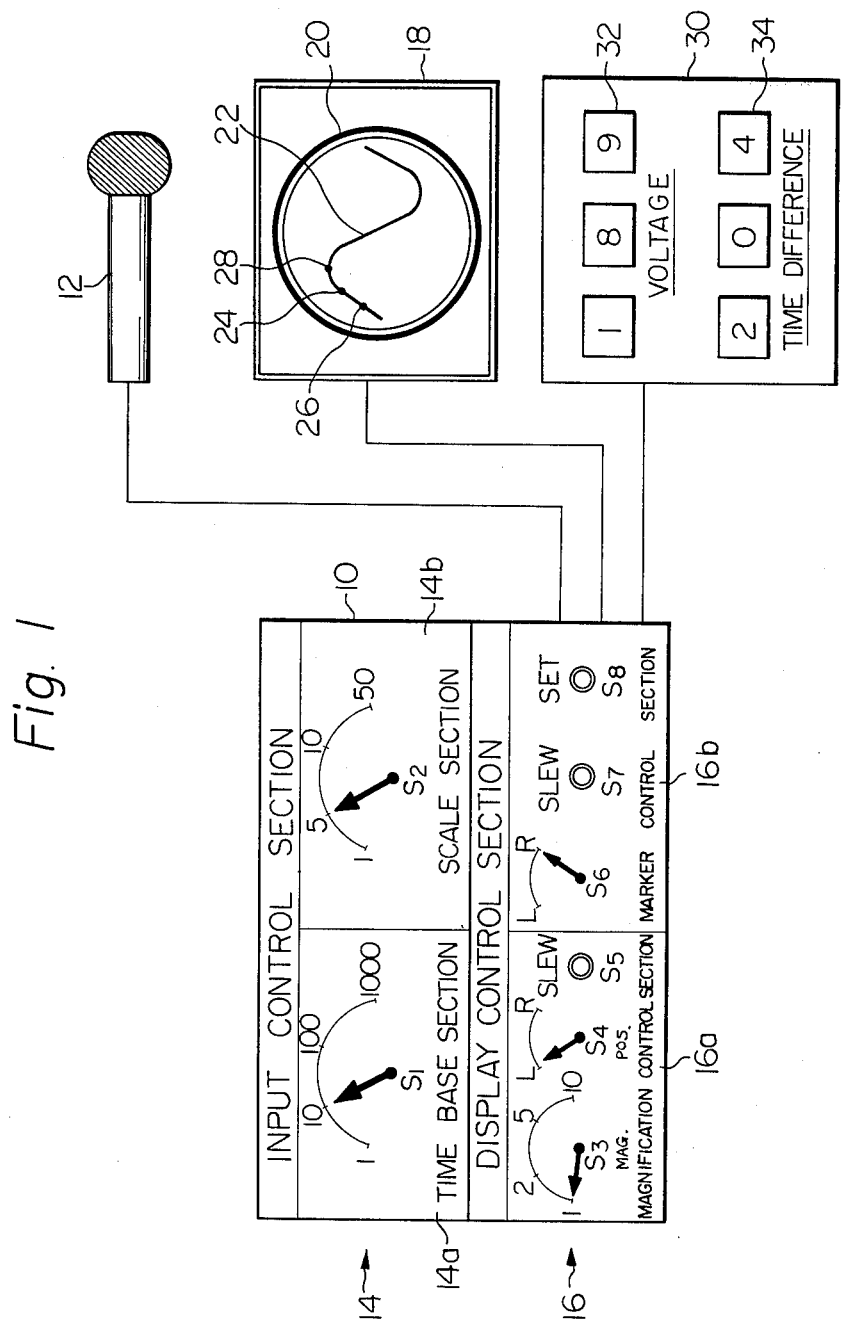
FIG. 1 is a plan view of a waveform analysis system embodying the present invention.

Referring to FIG. 1, a waveform analysis system embodying the present invention is shown as comprising waveform memory and control unit 10 which is designed to store in binary digital form a waveform fed thereto from a waveform generator such as a microphone 12. The microphone 12 is adapted to produce an electrical waveform representing a sound wave for voice print analysis, harmonic analysis for music studies or the like. An optical scanner (not shown) may replace the microphone 12 to produce an electrical waveform representing a signature, fingerprint or the like for suitable analysis.

The unit 10 comprises an input control section 14 and a display control section 16. The input control section 14 comprises a time base section 14a and a scale section 14b. The time base section 14a comprises a time base switch S1 which is switchable between four ranges to select a time duration during which the unit 10 will be enabled to store the waveform from the microphone 12. The scale section 14b comprises a scale switch S2 which is similarly switchable between four ranges to select a factor by which the input voltage to the unit 10 will be divided.

The system further comprises a cathode ray tube display unit 18 having a screen 20 to display the waveform stored in the unit 10. A sine waveform 22 is shown as being displayed on the screen 20 for exemplary purposes.

The display control section 16 of the unit 10 comprises a magnification control section 16a including a magnification range switch S3, a lift-right control switch S4 and a slew switch S5. The magnification range switch S3 is switchable between four ranges to select the magnification factor or range of the waveform 22 on the screen 20. With the magnification in range "1", the entire waveform 22 will be displayed on the screen 20. With the magnification in, for example, range "5", only one-fifth of the waveform 22 will fill the entire screen 20. As shown in FIG. 1, the magnification is in range "1" and a center marker 24 appears on the screen 20 as a bright spot on the waveform 22. This center marker 24 is movable left and right by means of the left-right switch S4 and slew switch S5. To move the center mark 24 leftward, the system operator places the switch S4 in the "left" position and pushes the slew switch S5. Changing the left-right switch S4 to the "right" position and pushing the slew switch S5 will move the center marker 24 rightward. The center marker 24 only moves when the slew switch S5 is pushed.

When the magnification range switch S3 is changed to, for example, range"5", the center marker 24 will no longer appear on the screen 20, but a point on the waveform 22 corresponding to the center marker 24 will be centered on the screen 20. The section of the waveform 22 consisting of one-fifth of the entire waveform 12 and having the said point as its center will fill the screen 22. The same said point will remain at the center of the screen 20 in all magnification ranges except for range "1". Furthermore, in all magnification ranges except for range "1", pushing the slew switch S5 will move the waveform 22 left or right relative to the center of the screen 20 depending on the position of the left-right switch S4.

The display control section 16 further comprises a marker control section 16 including a left-right switch S6, a slew switch S7 and a set switch S8. The marker control section 16b controls the positions of a fixed marker 26 and a movable marker 28 which appear as bright spots on the waveform 22. Pushing the slew switch S7 moves the movable marker 28 left or right dependng on the position of the left-right switch S6. Pushing the set switch S8 moves the fixed marker 26 to coincide with the movable marker 28. When the set switch S8 is released, the fixed marker 26 remains in position but the movable marker 28 moves. The movable marker 28 is used to designate a point on the waveform 22 at which the magnitude is desired to be meausre. The fixed marker 26 is used in conjunction with the movable marker 28 to measure the time difference or displacement between two points on the waveform 22. For example, the fixed marker 26 is positioned at a suitable reference point by the procedure described above, and the movable marker 28 is moved to measure the magnitude of the waveform 22 at various displacements from the reference point. As another example, the fixed marker 26 may be positioned on the positive peak of the waveform 22 and the movable marker 28 positioned on the negative peak to measure the displacement or time difference therebetween.

Also shown in FIG. 1 is an indicator unit 30 which comprises a digital voltage indicator 32 to numerically display the magnitude of the waveform 22 at the point designated by the movable marker 28 and a time difference indicator 34 to numerically display the time difference between the points on the waveform 22 corresponding to the markers 26 and 28. It will be noted that the time difference is correctly measured regardless of whether the movable marker 28 is to the left or right of the fixed marker 26.

Figure 2:
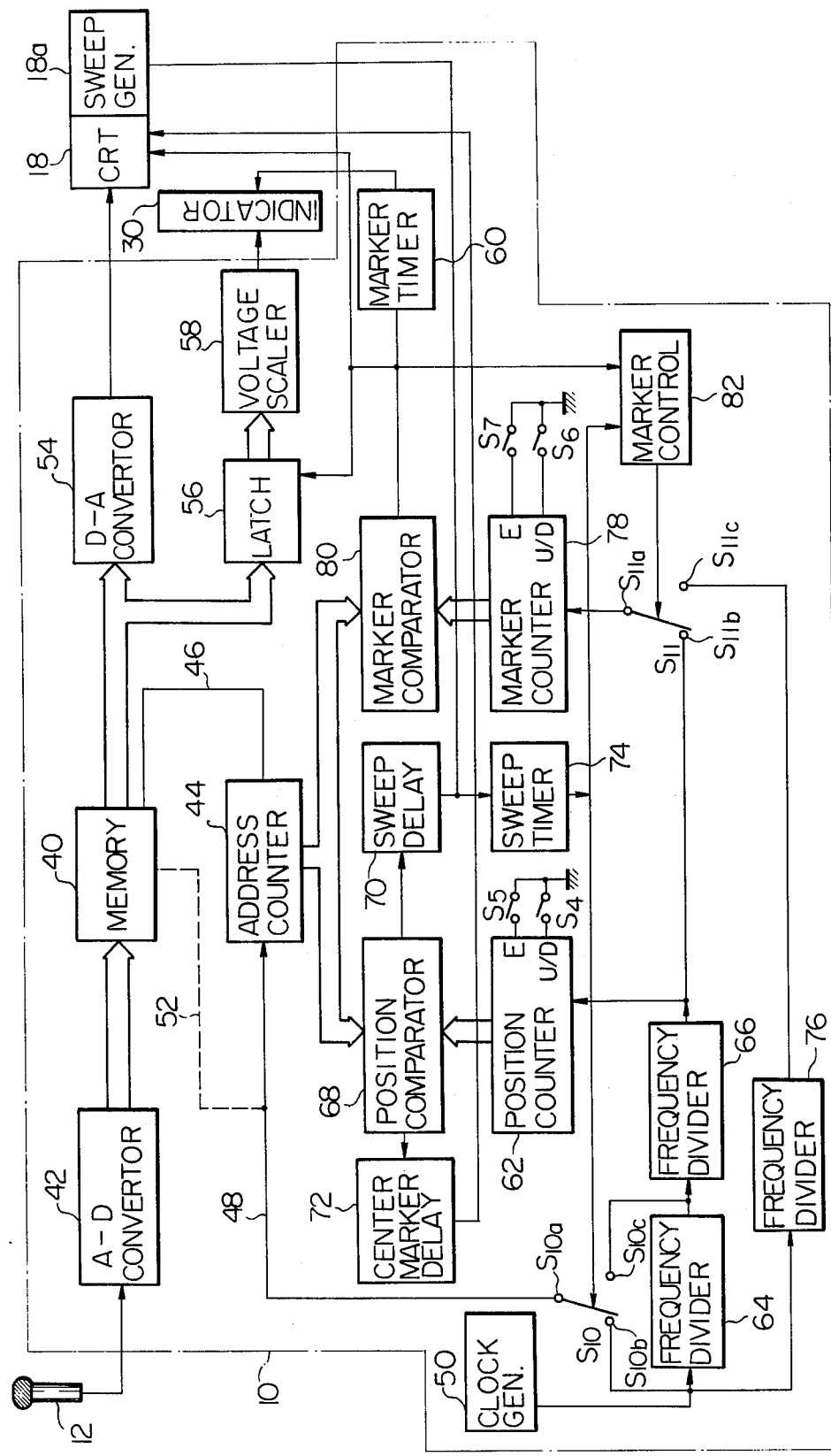
FIG. 2 is a block diagram of the waveform analysis system.

Referring now to FIG. 2, the memory and control unit 10 is shown in schematic block form as comprising a digital memory 40. The waveform 22 from the microphone 12 is fed into and stored in the memory 40 by means of an analog-to digital converter 42. A circulating address counter 44 is provided to sequentially address the memory locations (not designated) of the memory 40 for display on the screen 20 in synchronism with a scanning system of the display unit 18 as will be described below. The memory 44 may be in the form of an electronic random access memory (RAN), in which case the memory locations of the memory 40 are sequentially addressed by the address counter 44 through a line 46. The memory 40 may alternatively be a circulating shift register. In the latter case the line 46 is omitted.

The unit 10 further comprises a clock pulse generator 50 which generates clock pulses to druve the address counter 44 through a line 48. If the memory 40 is a shift register, the memory 40 is driven in synchronism with the address counter 44 by the clock pulses through a line 52 which is shown in phantom.

The waveform 22 is fed point by point by the scanning operation described above through a digital-to-analog converter 54 to the vertical deflection elements (not shown) of the cathode ray tube display unit 18. For magnification range "1", the entire waveform 22 is the memory 40 is applied to the display unit 18 during one horizontal sweep of the cathode ray tube controlled by a sweep signal from a horizontal sweep generator 18a.

When the memory location corresponding to the movable marker 28 is addressed by the address counter 44, the binary number in the memory location is latched into a latch 56, the output of which is applied through a voltage scaler 58 to the voltage indicator 32 of the indicator unit 30. The time difference between the markers 26 and 28 is applied to the time difference indicator 34 of the indicator unit 30 from a marker timer 60. The functions of the voltage scaler 58 and marker timer 60 are determined by the positions of the scale switch S2 and the time base switch S1 respectively.

The output of the clock pulse generator 50 is applied to the input of a position counter 62 through fequency dividers 64 and 66. A switch S10 has a movable contact S10a connected to the line 48 which is engagable with a fixed contact S10b connected to the output of the clock pulse generator 50. The movable contact S10a is further engagable with a fixed contact L10c connected to the output of the frequency divider 64. Although the switch S10 is symbolically shown as a mechanical switch, it is preferably an electronic switch comprising switching transistors or the like.

The position counter 62 is an up-down counter having an enable input E and an up-down selector input U/D. The slew switch S5 is connected between the enable input E and ground so as to enable the counter 62 when closed. The left-right switch S4 is connected between the up-down input U/D and ground in such a manner that closing the switch S4 causes the counter 62 to count down and move the center marker 24 leftward.

The outputs of both the address counter 44 and position counter 62 are connected to inputs of a position comparator 68. When the binary numbers in the counters 44 and 62 are equal, the comparator 68 generates a pulse which is fed to a sweep delay unit 70 and a center marker delay unit 72. The sweep delay unit 70 produces a sweep enable pulse at a predetermined time after receiving the pulse from the position comparator 68 which is applied to the sweep generator 18a as a horizontal synchronization pulse to trigger the sweep generator 18a. The sweep enable pulse from the sweep delay unit 70 is also applied to a sweep timer 74 which generates a timing pulse having a duration equal to the duration of the sweep signal produced by the sweep generator 18a which is fed to the switch S10. When the timing pulse from the sweep timer 74 is not produced, the switch S10 is controlled to connect the movable contact S10a to the fixed contact S10b. The timing pulse from the sweep timer 74 controls the switch S10 to connect the movable contact S10a to the fixed contact S10c for the duration thereof.

The center marker delay unit 72 is operative to produce a center marker pulse at a predetermined time after receiving the pulse from the position comparator 68. The center marker pulse is fed to the indicator unit 18 to modulate the electron beam of the cathode ray tube to produce a bright spot constituting the center marker 24. Although not shown, the center marker pulse may alternatively be applied to the vertical deflection elements of the cathode ray tube to produce a vartical line.

The output of the frequency divider 66 is also connected to a fixed contact S11b of a switch S11. The output of the clock pulse generator 50 is connected through a frequency divider 76 to another fixed contact S11c of the switch S11. A movable contact S11a of the switch S11 is connected to an input of a marker counter unit 78. The marker counter unit 78 will be described in detail below. An enable input E of the marker counter unit 78 is connected through the slew switch S7 to ground and an up-down input U/D is connected to ground through the left-right switch S6. The output of the marker counter unit 78 is connected to a marker comparator unit 80 which has another input connected to the output of the address counter 44. The output of the marker comparator unit 80 is connected to control the latch 56 so that an indicator enable signal produced by the marker comparator 80 when the count in the address counter 44 corresponds to the position of the movable marker 28 enables the latch 56. The indicator enable signal is also fed to the display unit 18 to modulate the beam of the cathode ray tube to produce a bright spot constituting the movable marker 28. A similar signal is fed from the marker comparator unit 80 to the display unit 18 to produce the fixed marker 26. Both of these signals are fed to the marker timer 60 for measurement of the time difference therebetween, and the indicator enable signal is also to a marker control unit 82.

The timing pulse from the sweep timer 74 is also fed to the marker control unit 82, which controls the switch S11. The switch S11 is preferably an electronic switch similar to the switch S10, although it is shown symbolically as a mechanical switch. The function and operation of the marker control unit 82 will be described below.

Figure 3:
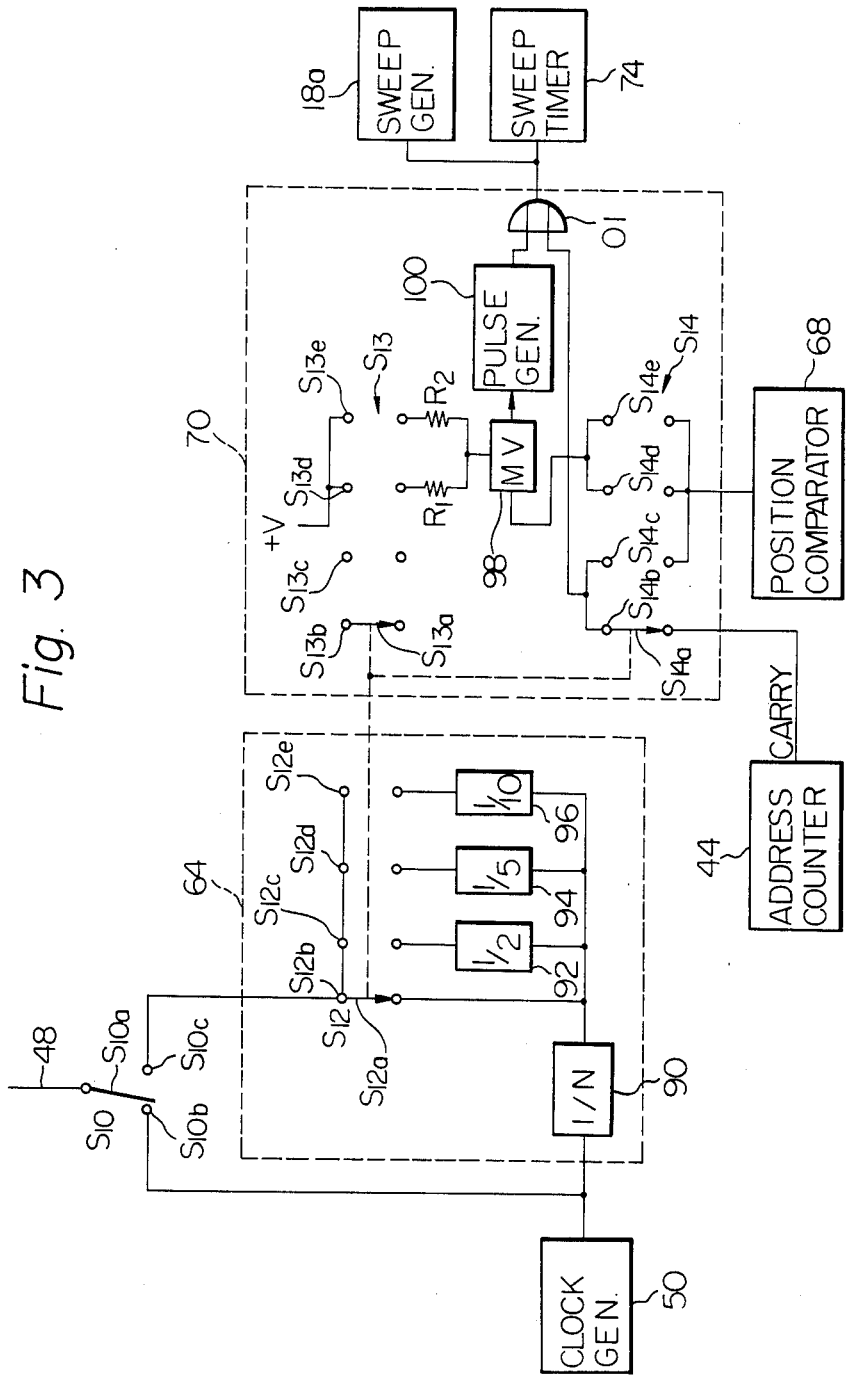
FIG. 3 is a schematic diagram of a magnification control system of the waveform analysis system.

The portion of the system for controlling the magnification of the waveform 22 on the screen 20 is shown in FIG. 3. The frequency divider 64 comprises a frequency divider 90 which is connected to multiply the frequency of the clock pulses from the clock pulse generator 50 by a ratio or factor of 1/N, where N is a number selected in accordance with the duration of the sweep signal produced by the sweep generator 18a. The output of the frequency divider 90 is connected in parallel to inputs of frequency dividers 92, 94 and 96.

The switch S3 in FIG. 1 comprises switches S12, S13 and S14.

The switch S12 has a movable contact S12a arranged to selectively connect the fixed contact S10c of the switch S10 to the outputs of the frequency dividers 90, 92, 94 and 96 through fixed contact sets S12b to S12e respectively. The switch S13 has a movable contact S13a which is ganged together with the movable contact S12a of the switch S12. The movable contact S13a is arranged to selectively bridge fixed contact sets S13b to S13e. The fixed contact sets S13b and S13c are unconnected. The fixed contact sets S13d and S13e are connected between a voltage source V and a control input of a monostable multivibrator 98 through resistors R1 and R2 respectively. The output of the multivibrator 98 is connected through a pulse generator 100 to an input of an OR gate 01, the output of which is connected to the input of the sweep timer 74.

The switch S14 has a movable contact S14a ganged together with the movable contacts S12a and S13a which is arranged to selectively bridge fixed contact sets S14b to S14e.

The address counter 44 is arranged to produce a carry pulse which is used as a synchronizing pulse indicating the beginning of a scanning operation of the memory 40 after the last storage location has been addressed. This carry pulse is produced at a carry output of the address counter 44 which is connected through the fixed contact set S14b to an input of the OR gate 01. The output of the position comparator 68 is connected through the fixed contact set S14c to the same input of the OR gate 01 as the carry output of the address counter 44. The output of the position comparator 68 is connected through the fixed contact sets S14d and S14e to the input of the multivibtaror 98.

The operation of the magnification portion of the system will now be described with reference also being made to FIGS. 4a to 4h.

In the actual waveform analysis system, the memory 40 preferably has thousands of storage locations so that the waveform 22 may be broken down into thousands of discrete points. In FIGS. 4a to 4h, the memory 40 is represented for the sake of simplicity of illustration and description as comprising only 20 storage locations. FIGS. 4a to 4d represent operation of the system in which it desired to place the memory location 5 in the center of the screen 20.

Figure 4A:
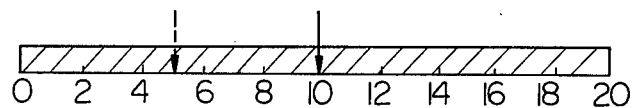
FIG. 4a to 4h are timing charts illustrating the operation of the magnification control system in simplified form.

For a magnification of "1" as illustrated in FIG. 4a, the switches S12 to S14 are actuated so that the movable contacts S12a, S13a and S14a bridge the fixed contact sets S12b, S13b and S14b respectively. In this case, the carry output of the address counter 44 is connected to the input of the sweep timer 74. The count or number in the position counter 68 is set at zero as will be described further below. As the address counter 44 resets from its maximum count to its zero count, the carry pulse is produced and is gated through the OR gate 01 to trigger the sweep timer 74, thereby constituting the sweep enable signal. Whereas the address counter 44 is normally connected to the output of the clock pulse generator 50 through the fixed contact S10b, the timing signal generated by the sweep timer 74 which has the same duration as the sweep signal produced by the sweep generator 18a actuates the movable contact S10a to move into engagement with the fixed contact S0c to connect the address counter 44 to the output of the frequency divider 90. The carry pulse is also gated through the OR gate 01 to the sweep generator 18a to trigger the horizontal sweep. The number N is selected so that the address counter 44 will be driven by the frequency divided clock pulses from the frequency divider 90 so that the memory 40 will be scanned or addressed completely during the horizontal sweep time of the cathode ray tube.

The center marker delay unit 72 is arranged to produce a center marker pulse at a time corresponding to 5 output pulses of the frequency divider 90 after receiving the output pulse from the position comparator 68. Since the number in the position counter 62 is zero, the center marker delay unit 72 will produce the center marker pulse to produce the center marker 24 on the screen 20 when the count in the address counter is 5 and the contents of the fifth storage location are being displayed on the screen 20. This is indicated by a phantom arrow in FIG. 4a. The center of the screen 20 is indicated by a solid arrow. The hatched area indicates the portion of the waveform 22 which will be displayed on the screen 20. In the case of magnification range "1", all 20 storage location will be displayed on the screen 20 as shown in FIG. 4a, and the center marker 24 will be displayed at a point corresponding to storage location 5.

For magnification range "2", the movable contacts S12a, S13a and S14a are moved to bridge the fixed contacts. S12c, S13c and S14c. The output of the position comparator 68 is now connected to the input of the sweep timer 74 through the OR gate 01. Since the count in the position counter 62 is zero, the position comparator 68 will produce a pulse when the address counter 44 begins its scanning operation. This pulse constitutes the sweep enable signal and triggers the sweep generator 18a and the sweep timer 74 to initiate the display scan operation. As in the above case, the timing signal from the sweep timer 74 connects the movable contact S10a of the switch S10 to the fixed contact S10c thereof. The clock pulse generator 50 is now connected to the address counter 44 through both of the frequency dividers 90 and 92.

Figure 4B:
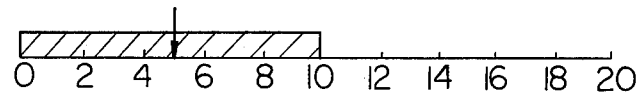

The frequency divider 92 is arranged to multiply the input pulse frequency applied thereto by a factor of $\frac{1}{2}$. so that the clock pulses are multiplied by the frequency dividers 90 and 92 in combination by a factor of $\frac{1}{2}N$. This means that the address counter 44 is driven at a rate such that it takes twice the duration of the horizontal sweep to address all of the storage locations. In this manner, only the first $\frac{1}{2}$ of the storage locations fill the entire screen 20. As shown in FIG. 4b, only the first 10 storage locations are displayed as indicated by hatching, and the storage location 5 is positioned in the center of the screen 20 as indicated by an arrow. At the termination of the timing signal of the sweep timer 74, the clock pulse generator 50 is again connected to the address counter 44 through the fixed contact S10b, so that for the second half of the memory addressing operation the address counter 44 is driven at high speed.

Figure 4C:
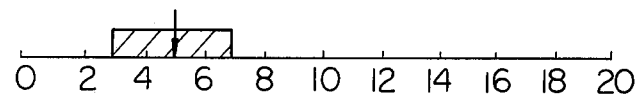

For magnification range "5", the movable contacts S12a, S13a and S14a are switched to bridge the fixed contact sets S12d, S13d and S14d respectively. The control input of the multivibrator 98 is connected to the supply +V through the resistor R1 and the output of the position comparator 68 is connected to the input of the multivibrator 98. Since the count in the position counter 62 is zero, the position comparator 68 produces an output pulse when the count in the address counter 44 is zero as in the above case. The multivibtator 98 is arranged to produce a pulse of variable duration as determined by the resistors connected between its control input and the supply +V. The resistor R1 has a value selected sto that the multivibtaror 98 will produce a pulse having a duration equal to 3 clock pulses in the exemplary case as illustrated in FIG. 4c.

The pulse generator 100 is arranged to produce a short pulse in response to the falling edge of the pulse produced by the multivibtator 98, which is gated through the OR gate 01 as the sweep enable signal to trigger the sweep generator 18a and sweep timer 74. Whereas the address counter 44 is driven at high speed by the undivided clock pulses up to the count of 3, the timing signal generated by the sweep timer 74 actuates the switch S10 so that the clock pulses are applied to the address counter 44 through the frequency dividers 90 and 94 which provide a multiplication ratio of 15N. Thus, only 1/5 of the waveform 22 will be displayed on the screen 20 starting with location 3 and ending with location 7 as shown by hatching in FIG. 4c. The center of this section is storage location 5 as in the above case. Upon termination of the timing signal from the sweep timer 74, the switch S10 is actuated so that the address counter 44 is driven at high speed.

For magnification range "10", the movable contacts S12a, S13a and S14a are switched to bridge the fixed contacts S12e, S13e and S14e respectively. The control input of the multivibtator 98 is connected to the supply +V through the resistor R2 and the output of the position comparator 68 is connected to the input of the multivibrator 98. The resistor R2 is arranged to provide a pulse duration equal to 4 clock pulses for the pulse produced by the multivibrator 98.

Figure 4D:
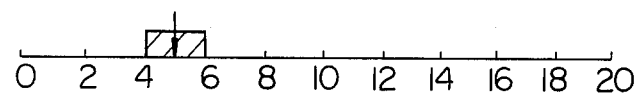
Figure 4E:
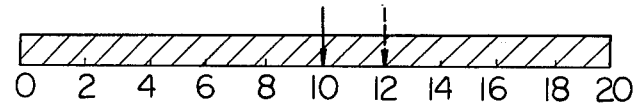

The multivibrator 98 is triggered when the count in the address counter 44 is zero as before, but the sweep enable pulse from the pulse generator 98 is produced and gated through the OR gate 01 to the sweep generator 18a and the sweep timer 74 when the count in the address counter 44 reaches 4. In this case, the clock pulses are multiplied by a rate of 1/10N by the frequency dividers 90 and 96, and only 1/10 or 2 of the storage locations appear on the screen 20. These are locations 4 to 6, and the location 5 is in the center of the screen 20 as desired as shown in FIG. 4d.

The operation as shown in FIGS. 4e to 4h is similar to that shown in FIGS. 4a to 4d respectively, except that the count in the position counter 62 is 7 so that storage location 12 will appear in the center of the screen 20. In magnification range "1", the position comparator 68 produces a pulse when the count in the address counter 44 is equal to the count in the position counter 62 which is 7. The center marker delay unit 72 produces the center marker pulse 5 pulses later so that the center marker 24 appears at location 12 on the screen 20.

Figure 4F:
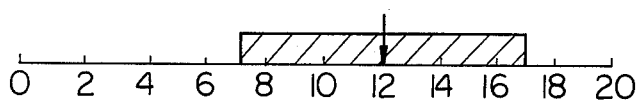
Figure 4G:
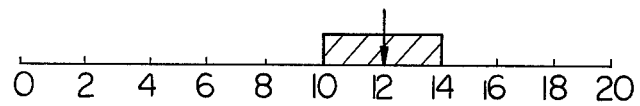
Figure 4H:
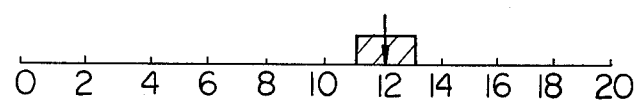

In magnification range "2", the sweep timer 74 and sweep generator 18a are triggered at count 7, and locations 7 to 17 are displayed on the screen 20 as shown in FIG. 4f, with the desired location 12 in the center.

In magnification range "5", the multivibrator 98 is triggered at count 7, and triggers the sweep generator 18a and sweep timer 74 after the delay of 3 counts at count 10. Locations 10 to 14 are thereby displayed with the same location 12 in the center as shwon in FIG. 4g.

In magnification range "10", the multivibrator 98 is triggered at count 7 and the sweep generator 18a and sweep timer 74 are triggered 4 counts later at count 11. Locations 11 to 13 are displayed with the center at 12.

Due to the operation of the sweep timers 74 and switch S10, the address counter 44 is driven at high speed before and after the storage locations for display in magnified from are scanned, and at divided speed to provide the magnified scanning. The multivibrator 98 is triggered at the count in the position counter 62 in magnification ranges "5"and "10"which corresponds to the first storage location displayed in magnification range "2". It will be understood that FIGS. 4a to 4h illustrate the operation of the magnification system in simplified form to clearly set forth the basic principles there, and that the actual operation of the system is more complicated. Although now shown, a gate unit is provided to suppress the center marker pulse except in magnification range "1".

Figure 5:
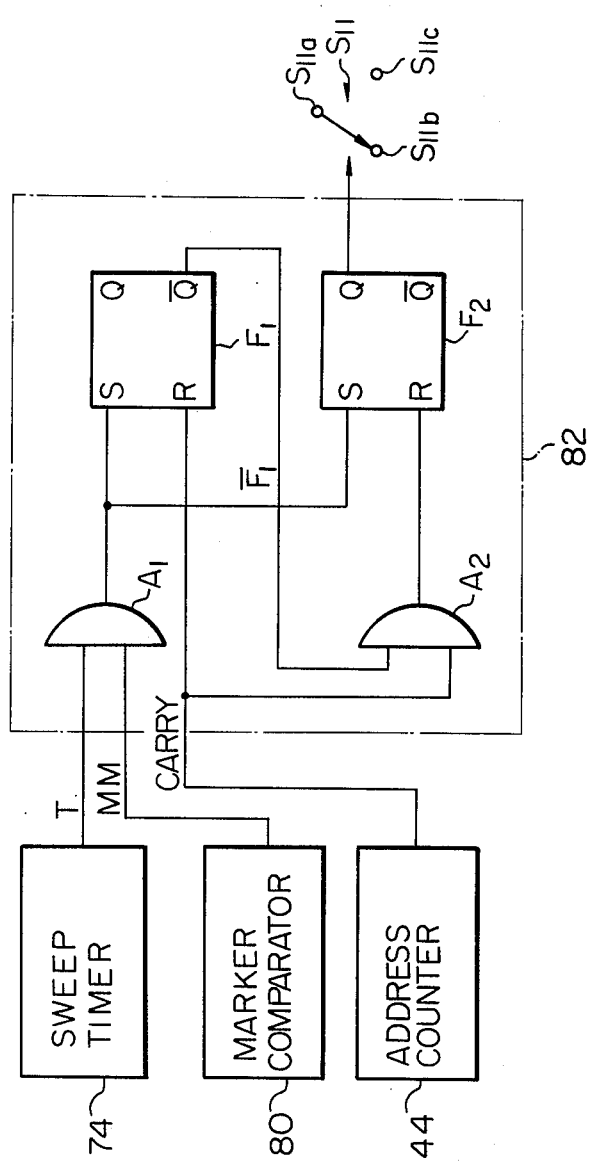
FIG. 5 is a schematic diagram of a marker control unit.
Figure 6:
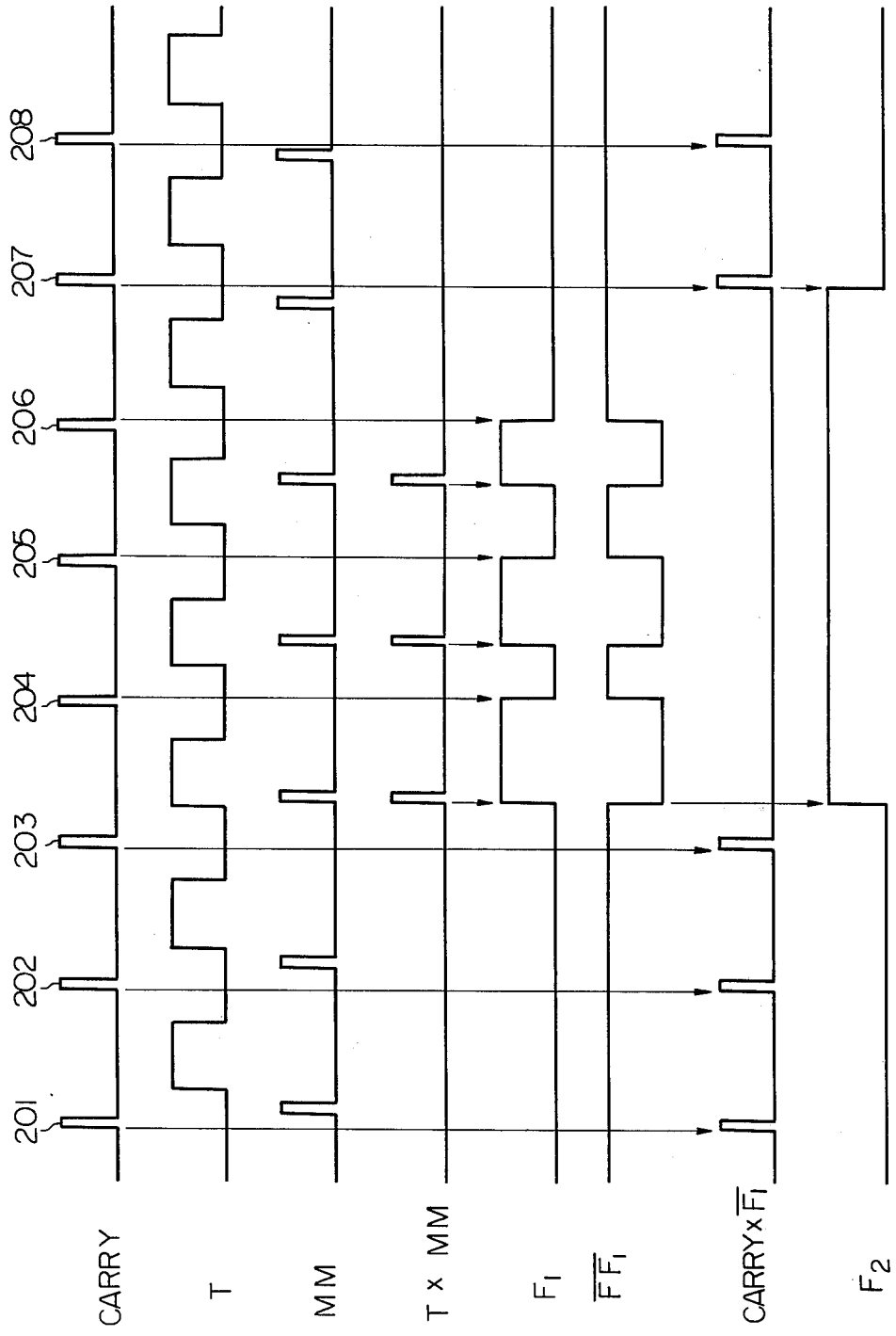
FIG 6 is a timing chart illustrating the operation of the marker control unit.

The detailed construction and operation of the marker control unit 82 is illustrated in FIGS. 5 and 6 respectively. The marker control unit 82 comprises and AND gate A1 having inputs connected to the sweep timer 74 and marker comparator 80 to receive the timing signal from the sweep timer 74 which is designated as T and the indicator enable signal which is designated as MM. The output of the AND gate A1 is connected to set inputs of flip-floos F1 and F2. The carry output of the address counter 44 is connected to the reset input of the flip-flop F1 and also to an input of an AND gate A2. The inverting or $\overline{Q}$ output of the flip-flop F1 is designated as F1 and connected to another input of the AND gate A2, the output of which is cnnected to the reset input of the flip-flop F2. The output of the flip- flop F2 is connected to control the switch S2.

The marker control unit 82 is designed to provide a high slew rate for the marker counter unit 78 when the movable marker 28 is not on the screen 20 in a magnified display mode so that it may be moved thereonto quickly. The slew rate is slowed down to a convenient value when the movable marker 28 is on the screen 20 at which the operator can accurately position the movable marker 28 at the desired measuring point. This operation is illustrated in FIG. 6.

Successive carry pulses are numbered 201 to 208 to facilitate description. It will be assumed that the movable marker 28 is initially positioned to the left of the displayed portion of the waveform 22 in a magnified display mode. Under these conditions, the flip-flop F1 is reset and the output $\overline{F1}$ is high to enable the AND gate A2. The carry pulse 201 is gated through the AND gate A2 to reset the flip-flop R2.

During the scanning operation between the carry pulses 201 and 203, the movable marker 28 is still to the left of the displayed portion of the waveform 22 and the indicator enable signal MM occurs before the timing signal T. The output of the AND gate A1 will remain low and the flip-flop F1 will remain reset. The carry pulses 202 and 203 are gated to the reset inputs of the flip-flops F1 and F2 but have no effect since the flip-flops F1 and F2 are already reset. The output of the flip-flop F2 remains low so that the switch S10 connects the clock pulse generator 50 to the marker counter unit 78 through the frequency divider 76 to slew the marker counter unit 78 at high speed.

In the interval between the carry pulses 203 and 204, the system aperator has slewed the movable marker 28 so that it is visible on the screen 20, and the indicator enable signal MM occurs in coincidence with the timing signal T. The AND gate A1 produces a high output which sets the flip-flops F1 and F2. The output of the flip-flop F2 becomes high to connect the marker counter unit 78 to the output of the frequency divider 66 so that the slew rate of the marker counter unit 78 is reduced to a convenient value. The output $\overline{F1}$ of the flip-flop F1 becomes low to inhibit the AND gate A2. The next carry pulse 204 resets the flip-flop F1 but not the flip-flop F2, so that the output of the flip-flop F2 remains high. This operation is repeated in the interval between the carry pulses 204 and 206.

In the interval between the carry pulses 206 and 207, the system operator has slewed the movable marker 28 off the screen 20 to the right, and the indicator enable signal MM in this interval occurs after the timing signal T. The flip-flops F1 and F2 are reset by the carry pulse 206 so that the $\overline{F1}$ output of the flip-flop F1 is high and the AND gate A2 is enabled. The carry pulse 207 thereby resets the flip-flop F2 to make the slew rate of the marker counter unit 82 high. The carry pulse 208 has no effect since the AND gate A2 remains inhibited. It will be seen that the marker control unit 82 provides a slow and managable slew rate for the movable marker 28 when the same is on the screen 20, and provides a high slew rate when the movable marker 28 is not on the screen 20. The slew rate is switched from high to low by the coincidence of the indicator enable signal MM and the timing signal T, and switched from low to high if a complete memory 40 scanning operation elapses without such coincidence occuring.

The output of the frequency divider 66 is connected to the inputs of the position counter 62 and the marker counter unit 78 when the magnified portion of the waveform 22 is being displayed and the movable marker 28 is on the screen 20. Since the output of the frequency divider 64 is connected to the input of the frequency divider 66, the position counter 62 and marker counter unit 78 will be driven at a rate proportional to the address rate of the memory 40. This means that the position and marker slew rates will be the same regardless of the degree of magnification. If, for example, the marker counter unit 78 was driven by clock pulses of the same frequency regardless of the magnification degree, the movable marker 28 would slew accross the screen 20 ten times faster in magnification range "10" than in magnification range "1". However, dividing the drive rates of the address counter 44 and marker counter unit 78 by the same factor ensures that the movable marker 28 will slew accross the screen 20 at the same speed in all magnification ranges.

Figure 7:
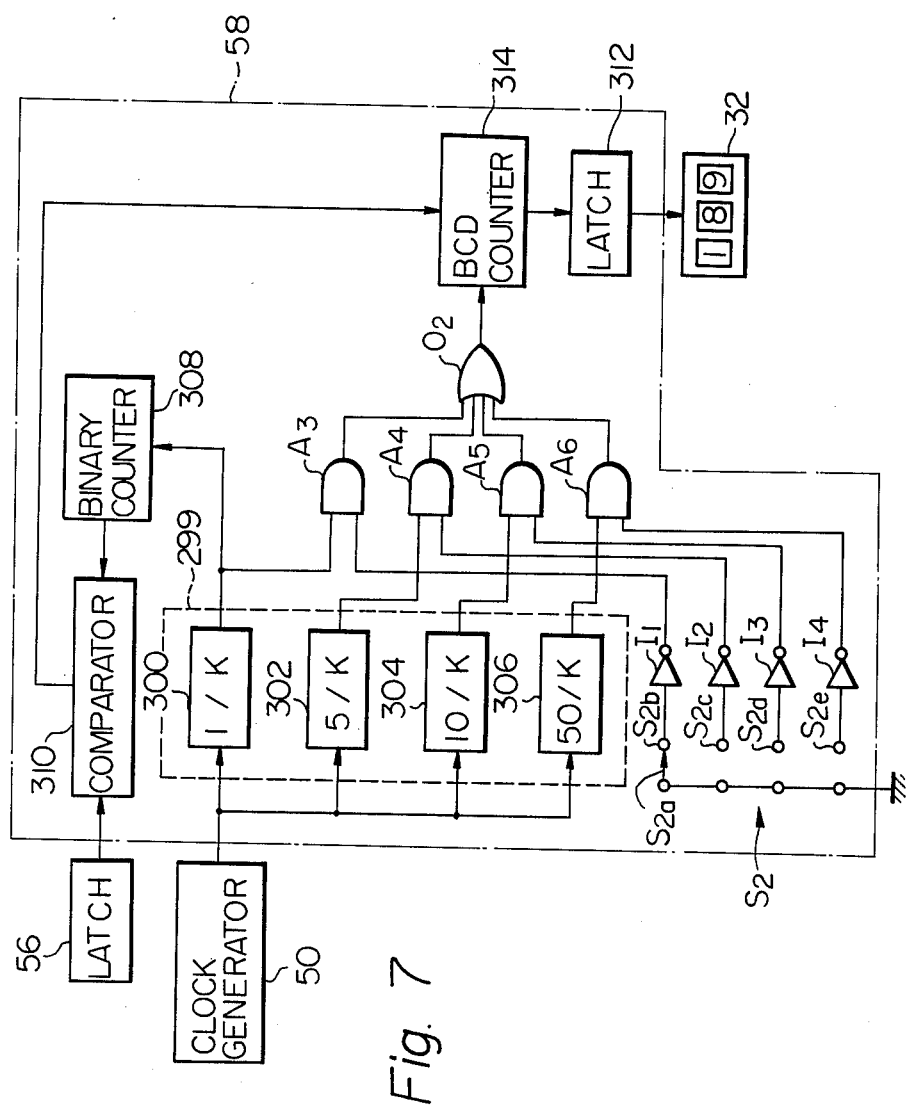
FIG. 7 is a schematic diagram of a magnitude or voltage indicator unit.

The voltage scaler unit 58 is shown in FIG. 7, and comprises a frequency divider unit 299 comprising four frequency dividers 300, 302, 304 and 306 which have inputs connected to the output of the clock pulse generator 50. The output of the frequency divider 300, which provides a frequency mulitiplication ratio of 1/K, where K is number selected in accordance with the number of times the voltage or magnitude indication is to updated per second, is connected to an input of a binary counter 308, The output of the binary counter 308 is connected to an input of a comparator 310, another input of which is connected to the ouput of the latch 56. The output of the comprator 310 is connected to an enable input of a latch 312, the output of which is connected to the voltage indicator 32.

The outputs of the frequency dividers 300, 302, 304 and 306 are connected to inputs of AND gates A3, A4, A5 and A6 respectively, the outputs of which are connected to inputs of an OR gate 02. The output of the OR gate 02 is connected to an input of a binary-doded-decinal (BCD) counter 314, the output of which is connected to the input of the latch 312.

The scale switch S2 has a movable contact S2a which is movable to selectively connect fixed contacts S2c to S2e to ground. The fixed contacts S2b to S2e are connected through inverters I1 to I4 to inputs of the AND gates A3 to A6 respectively. As will become clear from the following description of the operation of the voltage scaler unit 58, it functions as a binary to binary-coded-decimal converter with a variable multiplication factor.

Although now shown, the analog-to-digital converter 42 is provided with a resistor voltage divider or similar means for dividing the input voltage to the unit 10 by a factor of 1, 5, 10 and 50 as exemplary values. Since the binary numbers in the memory 40 therefore represent only fractions of the actual input voltages, it is necessary to multiply these numbers by the appropriate factors so that the number indicated by the voltage indicator 32 corresponds to the actual input voltage.

For a one-to-one representation in which the binary numbers in the memory 40 represents the actual value of input voltage, the switch S2 is in the position shown in FIG. 7 in which the movable contact S2a grounds the input of the inverter I1. This applies a high input to the AND gate A3 to enable the same. The binary number in the storage location designated by the movable marker 28 is latched into the latch 56, and the counters 308 and 314 are reset by a control unit (not shown). The clock pulses are then applied through the frequency divider 300 to the inputs of both the counters 308 and 314, so that they are incremented at the same rate and contain the same numerical value at all times. When the count in the binary counter 308 is the same as the number in the latch 56, the comparator 310 produces an indicator pulse which enables the latch 312. The binary-coded-decimal number having the same value as the binary number in the latch 56 is thereby indicated on the voltage indicator 32.

If the input voltage to the unit 10 was divided by a factor of 5, the switch S2 grounds the input of the inverter I2 to enable the AND gate A4. The output of the frequency divider 302, having a frequency multiplication ratio of 5/K is connected to the BCD counter 314. In this manner, the binary counter 308 is driven by the clock pulses at the clock pulse frequency divided by K whereas the BCD counter 314 is driven at the clock pulse frequency divided by 5/K, or 5 times faster. When the comparator 310 produces the indicator pulse indicating that the count in the binary counter 308 is equal to the binary number in the latch 56, the numerical value in the BCD counter 314 is exactly equal to 5 times that value. This number in the BCD counter 314 is latched into the latch 312 by the indicator pulse from the comprator 310 and indicated by the voltage indicator 32, and is the actual value of the voltage which was input to the unit 10.

The operation is similar for descaling factors of 10 and 50 utilizing the frequency dividers 304 and 306 which have frequency multiplication ratios of 10/K and 50/K respectively. The frequency dividers 304 and 306 are connected between the clock pulse generator 50 and the BCD counter 314 by grounding the inputs of the inverters I3 and I4 respectively by means of the switch S2.

Variations of the frequency divider unit 299 are illustrated in FIGS. 8a and 8b. In FIG. 8a, a frequency divider unit 299′ comprises 3 frequency dividers 320, 322 and 324 connected in series between the clock pulse generator 50 and the binary counter 308. The frequency dividers 320, 322 and 324 have frequency multiplication ratios of 1/5, ½ and 1/5 respectively. If the frequency multiplication ratio of the frequency dividers 320, 322 and 324 in combination is taken as unity, the frequency multiplication ratio at the output of the frequency divider 324 is 1, that at the output of the frequency divider 322 is 5, that at the output of the frequency divider 320 is $5 \times 2 = 10$ and that at the output of the clock pulse generator is $5 \times 2 \times 5 = 50$. A gate unit 326 selectively connects these outputs to the BCD counter 314. The frequency divider unit 299′ thereby provides the same function as the frequency divider unit 299.

In FIG. 8b, a frequency divider unit 299″ comprises frequency dividers 340, 342 and 344 which are connected in series between the clock pulse generator 50 and the binary counter 308, having frequency multiplication ratios of 1/10, ½ and 1/5 respectively. The outputs of the frequency dividers 340, 342 and 344 are connected to inputs of a gate unit 326′ for selective connection to the BCD counter 314. A frequency divider 346 is connected between the clock pulse generator 50 and another input of the gate unit 326′ for selective connection to the BCD counter 314. The frequency counter 346 has a frequency multiplication ratio of ½. If the frequency multiplication ratio at the output of the frequency divider 344 is taken as unity, the frequency multiplication ratio at the output of the frequency divider 342 is 5. The frequency multiplication ratio at the output of the frequency divider 340 is $5 \times 2 = 10$. The frequency multiplication ratio at the output of the clock pulse generator 50 is $5 \times 2 \times 10 = 100$. The frequency multiplication ratio at the output of the frequency divider 346 is $(5 \times 2 \times 10)/2 = 50$. It will be seen that the frequency divider unit 299″ provides the same function as the frequency divider unit 299.

Figure 9:
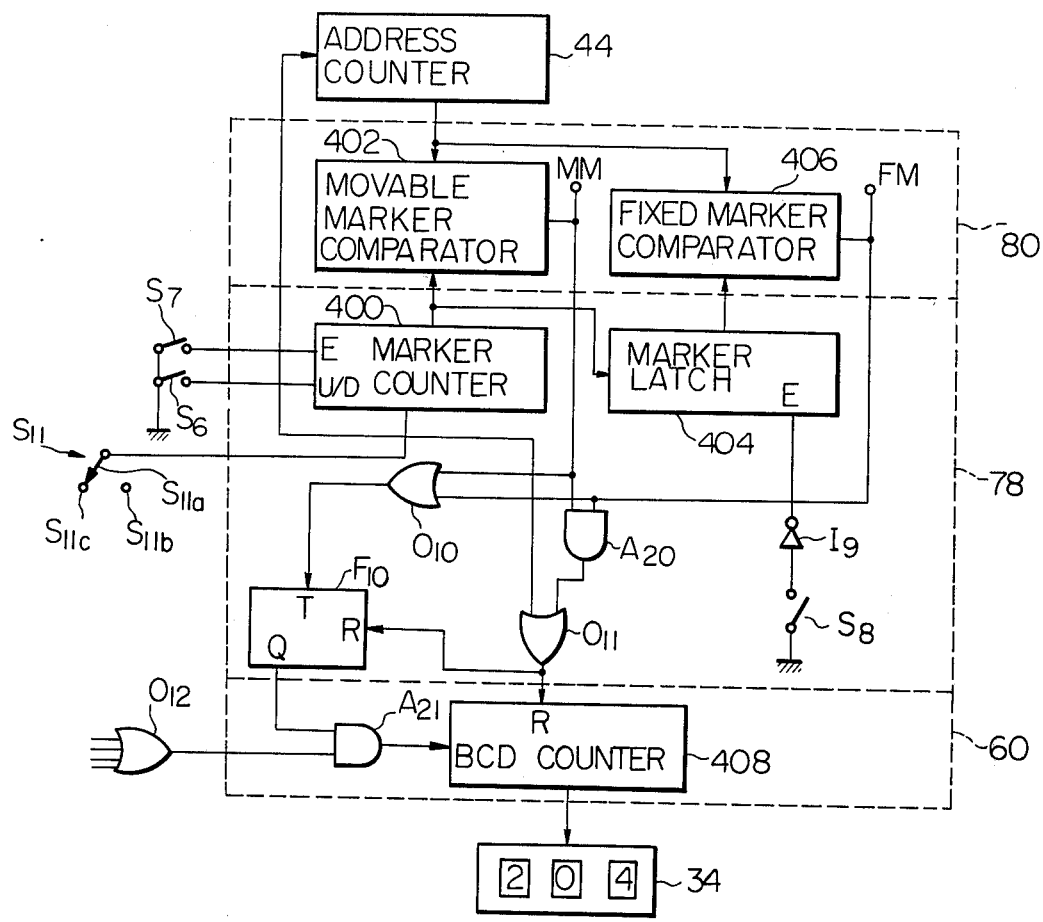
FIG. 9 is a schematic diagram of a time difference or displacement measurement control unit.
Figure 10:
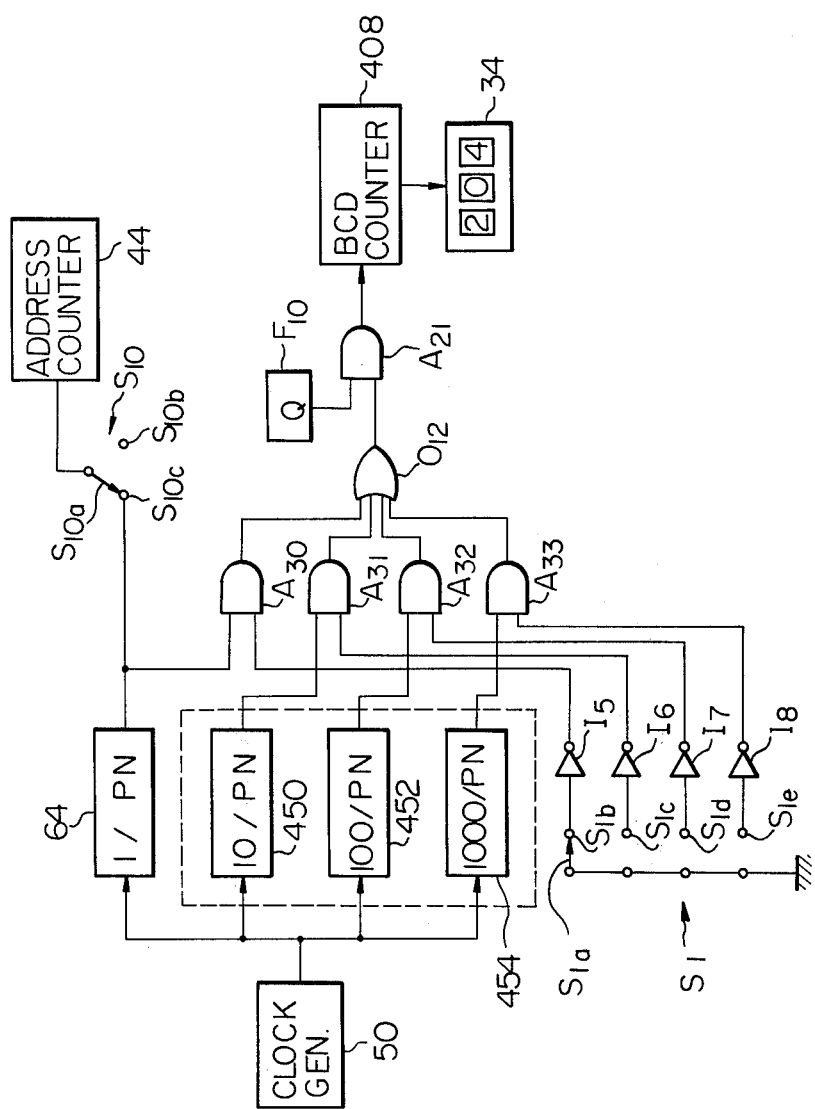
FIG. 10 is a schematic diagram of a time difference or displacement measuring unit.

The portion of the system for producing the fixed and movable markers 26 and 28 and measuring the time or displacement between them is shown in FIGS. 9 and 10. The marker counter unit 78 comprises a marker counter 400 having enable and up-down inputs connected to the switches S7 and S6 respectively. The input of the marker counter 400 is connected to the movable contact S11a of the switch S11. The output of the marker counter 400 is connected to inputs of a movable marker comparator 402 and a marker latch 404. The output of the marker latch 404 is connected to an input of a fixed marker comparator 406. The output of the address counter 44 is connected to inputs of the movable and fixed marker comparators 402 and 406 respectively. The indicator enable signal MM is produced at the output of the movable marker comparator 402 which is connected to inputs of an OR gate 010 and an AND gate A20. The fixed marker comparator 406 is arranged to produce a secondary indicator enable signal or fixed marker pulse FM which is fed to inputs of the OR gate 010 and the AND gate A20. The signals MM and FM are fed to the display unit 18 to produce the movable and fixed markers 28 and 26 respectively by modulating the intensity of the cathode ray tube beam.

The carry output of the address counter 44 and the output of the AND gate A20 are connected to inputs of an OR gate 011, the output of which is connected to a reset input of a binary-coded-decimal counter 408 which is part of the marker timer unit 60. The output of the OR gate 010 is connected to a trigger input of a T-type flip-flop F10. The output of the OR gate 011 is connected to a reset input of the flip-flop F10. The output of the flip-flop F10 is connected to an input of an AND gate A21, the output of which is connected to the input of the BCD counter 408. The output of an OR gate 012 is connected to another input of the AND gate A21. The output of the BCD counter 408 is connected to the time difference indicator 34. The set switch S8 is connected between ground and the input of an inverter I9, the output of which is connected to an enable input of the marker latch 404 so that the latch 404 is enabled when the switch S8 is closed.

In FIG. 10, the time base switch S1 has a movable contact S1a which is switchable to bridge fixed contact sets S1b to S1e to selectively ground inputs of inverters I5 to I8 respectively. The outputs of the inverters I5 to I8 are connected to inputs of AND gate A30 to A33, the outputs of which are connected to inputs of the OR gate 012. The output of the frequency divider 64 is connected to an input of the AND gate A30. Outputs of frequency dividers 450, 452 and 454 are connected to inputs of the AND gates A31 to A33 respectively. The inputs of the fequency dividers 450, 452 and 454 are connected to the output of the clock pulse generator 50.

The frequency multiplication ratio of the frequency divider 64 is designated as 1/PN, where P is 1, 2, 5 or 10 depending on the magnification range. The frequency dividers 450, 452 and 454 have frequency multiplication ratios of 10/Pn, 100/Pn and 1000/Pn as respective exemplary values. The frequency dividers 450, 452 and 454 are programable by means of a switch (not shown) integrally actuated by the switch S3, so that the value P is the same for the frequency dividers 64, 450, 452 and 454 in all magnification ranges.

For a time base range "1", the analog-to-digital converter 42 is operated in such a manner that there is a one-to-one correspondence between the addresses of the storage locations in the memory 40 and time. For example, a difference between two successive locations in the memory 40 may represent a time interval or differences of 1 microsecond.

In time base range "10", the input scanning operation of the converter 42 is slowed down by a factor of 10, so that a difference between two successive storage locations represents 10 microseconds. In the time base range "10", a waveform having a duration of, for example, 1/100 sec may be stored in the memory 40 whereas a waveform having a duration of only 1/1000 sec may be stored in the memory 40 in time base range "1". In the time base ranges "100" and "1000", the input conversion times are increased by factors of 100 and 1000 respectively. The portion of the system shown in FIG. 10 serves to descale the time base so that the number on the time difference indicator 34 indicates actual time difference between two points on the waveform in time In time base ranges "1", "10", "100"and "1000", the switch S1 is actuated to connected the outputs of the frequency dividers 64, 450, 452 and 454 to the input of the AND gate A21 by means of selective enabling of the AND gates A30 to A33 so that the frequency of pulses at the input of the AND gate A21 is equal to 1, 10, 100 and 1000 times the frequency of pulses at the input of the address counter 44 respectively.

The portion of the system shown in FIG. 9 serves to gate the pulses through the AND gate A21 for the time duration between generation of the signals MM and FM.

To position the movable marker 28, the operator pushes the switch S7 to enable the marker counter 400, with the switch S6 controlled to designate the slew direction. When the address counter 44 increments to the point at which the count therein is equal to the count in the marker counter 400, the movable marker comparator 402 generates the signal MM. To set the position of the fixed marker 26, operator pushes the switch S8 to latch the instantaneous count in the counter 400 into the latch 404. When the count in the address counter 44 equals the number in the latch 404, the fixed marker comparator generates the signal FM.

Referring also to FIG. 11, successive carry pulses are designated as 501 to 506. The first carry pulse 501 is gated through the OR gate 011 to reset the flip-flop F10 and counter 408. The movable marker 28 is initially to the left of the fixed marker 26, and the signal MM occurs before the signal FM. The signal MM is gated through the OR gate 010 and triggers the flip-flop F10 from the low state to the high state. The high output of the flip-flop F10 enables the AND gate A21 so that clock pulses are gated therethrough to the counter 408. The signal FM is gated through the OR gate 010 to the flip-flop F10 to trigger the same from the high state to the low state. The low output of the flip-flop F10 inhibits the AND gate A21 to terminate the gating of clock pulses therethrough. The counter 408 will therefore count clock pulses which are gated thereto during the time interval between the signals MM and FM. This count is indicated on the time difference indicator 34.

In accordance with the setting of the switch S1, in the time base range "10", if the storage locations corresponding to the signals MM and FM are, for example, spaced apart by 10 locations, during the time between the signals MM and FM 100 clock pulses will be applied to the counter 408 from the frequency divider 450. The time difference indicator 34 will therefore display an indication of "100". The operation is analogous for the other time base ranges, and the waveform is properly descaled.

In the intervals between the carry pulses 501 and 504, the movable marker 28 is positioned to the left of the fixed marker 26. If the operator slews the movable marker 28 to the right of the fixed marker 26, the signals MM and FM will appear as shown in the interval between the carry pulses 504 and 506. However, since the flip-flop F10 is set by the first of the signals MM and FM and reset by the other of the signals MM and FM, it does not matter which occurs first. In either case the output of the flip-flop F10 will be high for the duration between the signals MM and FM.

In the interval after the carry pulse 506, the signals MM and FM occur in coincidence, as when the set switch S8 is pressed. In this case, the AND gate A20 produces a high output which is gated through the OR gate 011 to reset the counter 408 and flip-flop F10.

Many modifications are possible for those skilled in the art within the scope of the present invention. For example, the marker latch 404 may be replaced by a counter identical to the marker counter 400. In this case, both markers would be independently movable.

What is claimed is:

1. A waveform analysis stysem, comprising:
a digital memory;
a display unit to display a waveform stored in the digital memory;
an address counter to sequentially address storage locations in the digital memory for display;
a marker counter to designate a storage location for display of a marker corresponding to said designated storage location on the display unit;
a clock pulse generator to generate clock pulses to drive the address counter and the marker counter;
marker counter switch means to selectively enable the marker counter to be driven by the clock pulses;
marker comparator means to sense for a same count in the address counter and the marker counter and generate an indicator enable signal in response thereto;
indicator means to numerically indicate contents of said designated storage location in response to the indicator enable signal; and
magnification means for controlling the display unit to display a selected section of the storage locations in magnified form;
the display unit further comprising a sweep generator for generating a sweep signal of predetermined duration, the magnification means comprising a frequency divider and magnification switch means for connecting the frequency divider between the clock pulse generator and the address counter while the sweep signal is being generated by the sweep generator.

2. A waveform analysis system, comprising:
a digital memory;
a display unit to display waveform stored in the digital memory;
an address counter to sequentially address storage locations in the digital memory for display;
a marker counter to designate a storage location for display of a marker corresponding to said designated storage location on the display unit;
a clock pulse generator to generate clock pulses to drive the address counter and the marker counter;
marker counter switch means to selectively enable the marker counter to be driven by the clock pulses;
marker comparator means to sense for a same count in the address counter and the marker counter and generate an indicator enable signal in response thereto;
indicator means to numerically indicate contents of said designated storage location in response to the indicator enable signal;
magnification means for controlling the display unit to display a selected section of the storage locations in magnified form; and
a position counter to select the selected section of storage locations to be displayed in magnified form and position the selected section at a predetermined position on the display unit.

3. The waveform analysis system of claim 2, in which the digital memory comprises a shift register which is driven in synchronism with the address counter by the clock pulses.

4. The waveform analysis system of claim 2, in which the digital memory comprises an electronic random access memory.

5. The waveform analsis system of claim 2, in which the marker counter is an up-down counter, the marker counter switch means being operative to selectively enable the up-down counter to be driven up and down by the clock pulses.

6. The waveform anaysis system of claim 2, in which the position counter is driven by the clock pulses, the mafnification means further comprising position counter switch means to selectively enable the position counter to be driven by the clock pulses.

7. The waveform analysis system of claim 6, in which the position counter is an up-down counter, the position counter switch means being operative to selectively enable the up-down counter to be driven up and down by the clock pulses.

8. The waveform analysis system of claim 2, in which the magnification means further comprises position comparator means to sense for a same count in the address counter and position counter and generate a sweep enable signal in response thereto, the display unit comprising a sweep generator triggered by the sweep enable signal to generate a sweep signal.

9. The waveform analysis system of claim 8, in which the sweep signal has a predetermined duration, the magnification means further comprising frequency divider and magnification switch means to connect the frequency divider between the clock pulse generator and the address counter while the sweep signal is being generated by the sweep generator.

10. The waveform analysis system of claim 9, in which the magnification switch means is further operative to connect the frequency divider between the clock pulse generator and the position counter while the sweep signal is being generated by the sweep generator.

11. The waveform analysis system of claim 9, in which a frequency division ratio of the frequency divider is variable.

12. The waveform analysis system of claim 10, in which the frequency divider is operative to provide a greater frequency division ratio between the clock pulse generator and the position counter than between the clock pulse generator and the address counter.

13. The waveform analysis system of claim 8, in which the magnification means further comprises a delay unit connected between the position comparator means and the sweep generator.

14. The waveform analysis system of claim 11, in which the magnificationmeans further comprises a variable delay unit connected between the position comparator means and the sweep generator, a duration of delay of the delay unit being variable in accordance with the frequency division ratio of the frequency divider.

15. The waveform analysis system of claim 8, further comprising marker counter control means having a frequency divider and marker counter switch means to connect the frequency divider between the clock pulse generator and the marker counter in response to coincidence of the indicator enable signal and the sweep signal.

16. The waveform analysis system of claim 15, in which a frequency division ratio of the frequency divider is variable.

17. The waveform analysis system of claim 15, further comprising synchronizing pulse generator means to generate a synchronizing pulse the address counter addresses a last storage location, the marker counter switch means being further operative to disconnect the frequency divider from between the clock pulse generator and the marker counter in response to an absence of coincidence of the indicator enable signal and the sweep signal between two consecutive sychronizing pulses.

18. The waveform analysis system of claim 17, in which the marker counter switch means comprises a first AND gate having inputs connected to receive the indicator enable signal and the sweep signal, first and second flip-flops, an output of the first AND gate being connected to set inputs of the first and second flip-flops, a reset input of the first flip-flop being connected to receive the synchronizing pulse, a second AND gate having an input connected to receive the sychronizing pulse and another input connected to an inverting output of the first flip-flop, an output of the second AND gate being connected to a reset input of the second flip-flop, an output of the second flip-flop being operatively connected to connect and disconnect the frequency divider between the clock pulse generator and the marker counter.

19. A waveform analysis system, comprising:
a digital memory;
a display unit to display a waveform stored in the digital memory;
an address counter to sequentially address storage locations in the digital memory for display;
a marker counter to designate a storage location for display of a marker corresponding to said designated storage location on the display unit;
a clock pulse generator to generate clock pulses to drive the address counter and the marker counter;
marker counter switch means to selectively enable the marker counter to be driven by the clock pulses;
marker comparator means to sense for a same count in the address counter and the marker counter and generate an indicator enable signal in response thereto; and
indicator means to numerically indicate contents of said designated storage location in response to the indicator enable signal, the digital memory being arranged to store the waveform in the form of binary numbers in the respective storage locations, the indicator means comprising a binary to binary-coded-decimal converter, the converter comprising a binary counter driven by the clock pulses, a latch to store a binary number constituting the contents of said designated storage location in response to the indicator enable signal;
an indicator comparator to sense for a same binary number in the latch and the binary counter and generate an indicator signal in response thereto, a binary-coded-decimal counter driven by the clock pulses; and
an indicator to indicate contents of the binary-coded-decimal counter in response to the indicator signal.

20. The waveform analysis system of claim 19, in which the indicator means further comprises a variable frequency divider connected between the clock pulse generator and the binary and binary-coded-decimal counters to divide the clock pulses at a different ratio between the clock pulse generator and the binary counter and between the clock pulse generator and the binary-coded-decimal counter.

21. A waveform analysis system, comprising:
a digital memory;
a display unit to display a waveform stored in the digital memory;
an address counter to sequentially address storage locations in the digital memory for display;
a marker counter to designate a storage location for display of a marker corresponding to said designated storage location on the display unit;
a clock pulse generator to generate clock pulses to drive the address counter and the marker counter;
marker counter switch means to selectively enable the marker counter to be driven by the clock pulses;
marker comparator means to sense for a same count in the address counter and the marker counter and generate an indicator enable signal in response thereto;
indicator means to numerically indicate contents of said designated storage location in response to the indicator enable signal;
a secondary marker counter to designate a secondary storage location for display of a secondary marker corresponding to said secondary storage location on the display unit;
the marker counter switch means being further operative to selectively enable the secondary marker counter to be driven by the clock pulses;
secondary marker comparator means to sense for a same count in the address counter and the secondary marker counter and generate a secondary indicator enable signal in response thereto;
time measurement means for measuring a time interval between the indicator enable signal and the signal indicator enable signal; and
time indicator means to indicate the measured time interval.

22. The waveform analysis system of claim 21, in which the time measurement means comprises:
a timer counter drivable by the clock pulses; and
gate means operative to gate the clock pulses to the timer counter during the time interval between the indicator enable signal and the secondary indicator enable signal.

23. The waveform analysis system of claim 22, in which the gate means comprises:
an OR gate having inputs connected to receive the indicator enable signal and the secondary indicator enable signal; and
a flip-flop connected to an output of the OR gate so as to be set by one of the indicator enable signal and the secondary indicator enable signal and reset by the other of the indicator enable signal and the secondary indicator enable signal; and
an AND gate having an input connected to an output of the flip-flop and another input connected to receive the clock pulses and an output connected to an input of the timer counter.

24. The waveform analysis system of claim 23, further comprising synchronizing pulse generator means arranged to generate a synchronizing pulse after the address counter addresses a last storage location, reset inputs of the flip-flop and the timer counter being connected to receive the synchronizing pulse.

25. The waveform analysis system of claim 22, in which the time measurement means further comprises a variable frequency divider connected between the clock pulse generator and the timer counter.

* * * * *